United States Patent [19] [11] 4,402,133

Cribbs et al. [45] Sep. 6, 1983

[54] CONTACT PULLER

[75] Inventors: Doyle E. Cribbs, Titusville; James R. Weckerly, Kennerdell, both of Pa.

[73] Assignee: GTE Products Corporation, Conn.

[21] Appl. No.: 336,147

[22] Filed: Dec. 31, 1981

[51] Int. Cl.$^3$ ........................ H05K 3/30; H01R 43/00

[52] U.S. Cl. ........................................ 29/739; 29/252; 29/747; 29/758; 29/762; 29/764; 81/301; 294/88

[58] Field of Search ................. 29/739, 747, 764, 762, 29/758, 845, 252; 294/88; 81/301; 254/93 R

[56] References Cited

U.S. PATENT DOCUMENTS

| | | | |
|---|---|---|---|
| 3,786,550 | 1/1974 | Jones | 29/252 X |
| 3,791,011 | 2/1974 | Keys | 29/252 |
| 4,028,790 | 6/1977 | Dupuis | 29/764 |

*Primary Examiner*—Carl E. Hall

*Attorney, Agent, or Firm*—John A. Odozynski

[57] ABSTRACT

A hand tool for inserting a contact or pin into electrical components which tool subsequently resets itself for inserting another contact. Such tool transfers manual mechanical energy to hydraulic energy thereby allowing for reducing the size of the tool.

15 Claims, 3 Drawing Figures

CONTACT PULLER

BACKGROUND OF THE INVENTION

This invention is directed to a tool for inserting a contact or pin into electrical components. In particular, the invention relates to such a tool which may be used in a restricted environment to insert an elongated contact and to subsequently reset itself for inserting another contact. Such insertion is commonly referred to as "pulling".

It is often desirable to insert an elongated contact or pin into an electrical component, as for example, when the component must be repaired. Often such work can only be done in the field. Many electrical components requiring such contact insertion are difficult to work with. This is particularly true in those instances involving pins or contacts soldered in printed circuit boards. The problem is further complicated in circuit boards having many pins or contacts closely spaced and in equipment having many components closely stacked or otherwise positioned in close proximity one to the other.

For field work it is particularly desirable to have a tool which can be simply and reliably used to insert a pin or contact as quickly as possible without damaging the electrical component being repaired. It is also desirable to have a tool which resets itself after a contact has been inserted. It is also particularly desirable to have a tool which may be used in one hand. Also desirable is to have a tool which transfers manual mechanical energy to hydraulic energy thereby allowing for reducing the size of the tool.

SUMMARY OF THE INVENTION

This invention achieves the foregoing objects by providing a tool for pulling a contact comprising a barrel having a bore extending axially therethrough. A first stop member is positioned internally of the barrel to plug the bore and define a first bore cavity to one side of the stop member and a second bore cavity to the other side of the stop member. The first stop member includes an aperture therethrough which extends from the first bore cavity to the second bore cavity. Also provided is an elongated rod positioned in the bore and extending through the aperture from the first bore cavity to the second bore cavity. The rod includes a second stop member positioned along the portion of the rod extending to the first bore cavity. Means are attached to the end of the rod for gripping a pin or contact to be pulled. Such gripping means include at least one camming surface. A first piston is fixedly attached to the opposite end of the rod and extends into the second bore cavity. A second piston is slidably attached to the rod in the first bore cavity. Such second piston is positioned between the first and second stop members and includes a cam follower which engages the camming surface. First means are attached to the barrel to move the first piston towards the first stop member so that the elongated rod attached to the first piston moves the camming surface relative to the cam follower to relieve the gripping means. A second means is attached to the barrel to move the second piston towards the second stop member so that the cam follower is moved relative to the camming surface to close the gripping means, and then move the first piston away from the first stop member so that the elongated rod attached to the first piston moves the second piston and the gripping means towards the first stop member.

BRIEF DESCRIPTION OF THE DRAWINGS

This invention may be clearly understood by reference to the drawings in which.

DESCRIPTION OF THE PREFERRED EMBODIMENT

Figure 1:
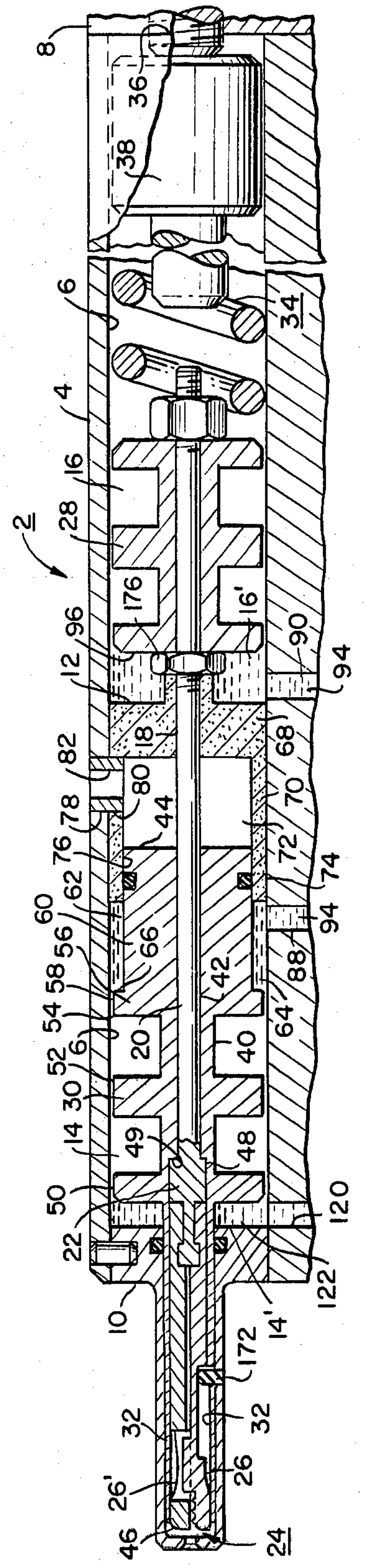
FIG. 1 is a partial side elevational view of the tool.

The embodiment of this invention which is depicted in the drawings is one which is particularly suited for achieving the objects of the invention. The drawings depict an apparatus 2 for pulling a contact comprising a barrel 4 having a bore 6 extending axially of the barrel. The barrel includes a first end 8 and a second end 10. A first stop member 12 is positioned internal of the barrel 4 and for plugging the bore 6 to define a first bore cavity 14 to one side of the first stop member and to define a second bore cavity 16 to the opposite side of the first stop member 12. The first stop member 12 includes an aperture 18 therethrough which extends from the first bore cavity to the second bore cavity. An elongated rod 20 is positioned in the bore 6 such that the rod extends through aperture 18 from the first bore cavity 14 to the second bore cavity 16. Rod 20 includes a second stop member 22 positioned along the portion of the rod which extends into the first bore cavity 14. In the preferred embodiment stop member 22 is integral with and forms a part of rod 20. Means generally designated 24 are attached to one end of rod 20 for gripping a pin to be pulled. Such gripping means which includes at least one camming surface 26, will be described in greater detail hereinafter. A first piston 28 is fixedly attached to the opposite end of the rod 20 which end extends into the second bore cavity 16. A second piston 30 is slideably attached to rod 20 in the first bore cavity 14 such that the second piston 30 is positioned for movement between the first stop member 12 and the second stop member 22. Piston 30 includes a cam follower 32 which engages the camming surface 26.

A first means is attached to the barrel 4 to move the first piston 28 towards the first stop member 12 so that the elongated rod 20 attached to the first piston 28 moves the camming surface 26 relative to the cam follower 32 to relieve the gripping means 24. Such first means may comprise, for example, a spring 34 internal of the bore 6 and extending between the first end 8 of the barrel and the first piston 28. The degree of force which spring 34 exerts against piston 28 may be adjusted by turning bolt 36 to selectively cause spring cap 38 to further compress or relieve spring 34.

In the preferred embodiment the second piston 30 comprises an elongated cylindrical member 40 slideably attached to rod 20 by a first elongated bore 42 extending from one end 44 of the cylindrical member 40 towards the other end 46. The elongated cylindrical member 40 also includes a second elongated bore 48 of greater diameter than the first elongated bore 42 and extending from the end 46 towards end 44. The inner surface of the elongated cylindrical member nearest end 46 includes the cam follower 32. Cylindrical member 40 also includes a first shoulder 49 where the first elongated bore 42 and a second elongated bore 48 meet. The outer surface of said cylindrical member includes cylindrical rib portions extending therefrom. For example, in the preferred embodiment ribs 50, 52 and 54 are provided which are integral with and form a part of cylindrical member 40. Cylindrical rib 54 includes a first cylindrical portion 56 nearest but spaced from end 46 and including a surface 58, and a portion 60 nearest end 44. The second cylindrical portion 60 is of less diameter than the first cylindrical portion 56 and includes a surface 62 spaced from the surface of the bore 6 of barrel 4 to form a first chamber 64. Cylindrical rib 54 includes a second shoulder 66 where the first cylindrical portion 56 and second cylindrical portion 60 meet.

In the preferred embodiment, first stop member 12 includes a cylindrical body 68 positioned within and engaging the surface of the bore 6 of the barrel. The body 68 includes a cylindrical sleeve 70 integral therewith which extends from the body 68 to form an air chamber 72. The outer surface 74 of sleeve 70 engages the surface of the bore of the barrel, and the inner surface 76 of sleeve 70 engages the spaced surface 62 of cylindrical rib 54. As depicted in FIG. 1, the barrel 4 includes a first vent or aperture 78 and sleeve 70 includes a second vent or aperture 80 extending to air chamber 72. The vents are in communication one with the other. A tubular member 82 may be provided to maintain such communication.

A second means is attached to barrel 4 to move the second piston 30 towards the second stop member 22 so that the cam follower 32 is moved relative to the camming surface 26 to close the gripping means 24. The second means also moves the first piston 28 away from the first stop member 12 so that the elongated rod 20 attached to the first piston 28 moves the second piston 30 and the gripping means 24 towards the first stop member 12. In the preferred embodiment, the second means includes a body 84 having a second chamber 86 therein. A first passage 88 extends indirectly between the first chamber 64 and second chamber 86. A second passage 90 extends between the second chamber 86 and the second bore cavity 16 at a position between the first stop member 12 and the first piston 28. A third passage 92 extends between the first and second passages. The first passage 88 extends between chambers 64 and 86 by means of passages 90 and 92. A first fluid 94 is positioned within chambers 64 and 86 and passages 88, 90 and 92. Means is attached to body 84 for compressing the first fluid 94 and causing such fluid to exert a first force against the second shoulder 66 to slide the second piston 30 towards the second stop member 22 and subsequently causing such fluid to exert a second force against the first piston 28 to move the first piston 28 away from the first stop member 12. As depicted in FIG. 1, the surface area of the fluid engaging surface 96 of the first piston 28 is greater than the surface area of the second shoulder 66.

Figure 2:
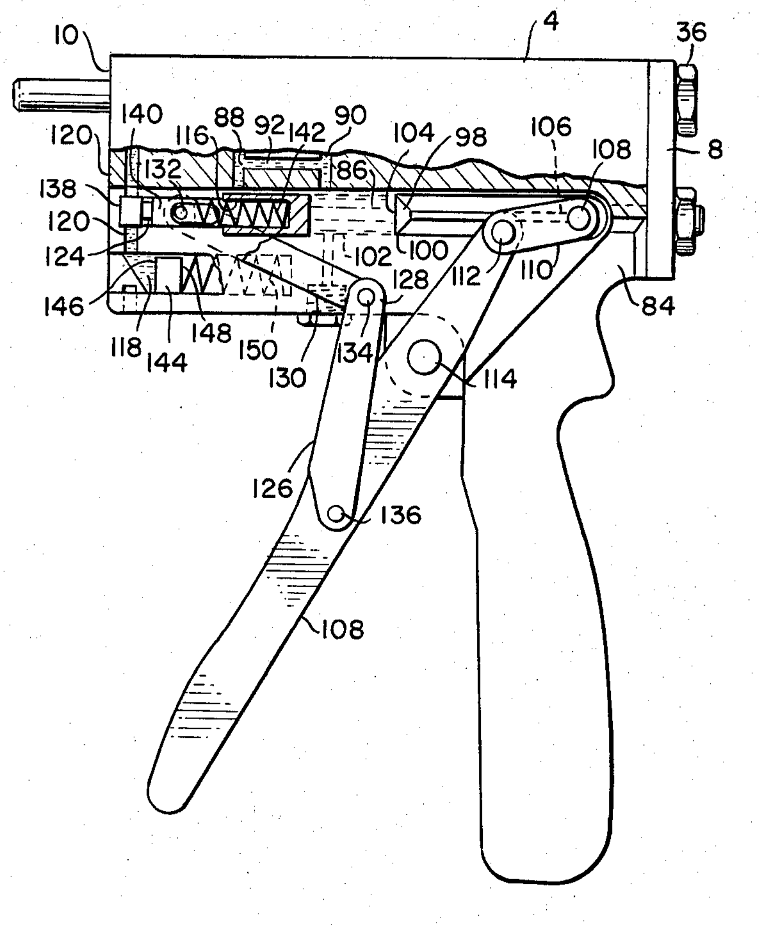
FIG. 2 is a side elevational view of the tool.

The means for compressing fluid 94 includes a plunger 98 positioned within second chamber 86. The outer surface 100 of plunger 98 is in engagement with the surface 102 of the second chamber 86. The plunger includes a first end 104 which engages the first fluid 94 and a second end 106. Body 84 further includes a lever 108 pivotally attached to the body, and to the second end 106 of the plunger 98 at pin 108. As depicted in FIG. 2 such attachment may also include a link 110 and pivot pins 112 and 114.

Body 84 further includes a third chamber 116 therein, a fourth chamber 118 therein, and a fourth passage 120 extending between the third chamber 116 and fourth chamber 118. Fourth passage 120 also extends between third chamber 116 and the first bore cavity 14 at a position between the second piston 30 and the second end 10 of barrel 4. A second fluid 122 is positioned in chambers 14' and 118 and Passage 120. A valve 124 is mounted for movement within third chamber 116 into and out of the fourth passage 120 to close and open the fourth passage, respectively. Valve moving means are provided which includes a trigger 126 having one end 128 pivotally attached through link 130 and pins 132, 134 to the valve. The other end of the trigger is pivotally attached to lever 108 at pin 136. Valve 124 includes a first end 138 extending towards the fourth passage 120 and a second end 140 extending away from the fourth passage 120. A spring 142 is positioned within the third chamber 116 and engages the second end 140 of the valve to urge the valve towards the fourth passage 120.

In the preferred embodiment means are positioned within the fourth chamber 118 for urging the fluid towards the first bore cavity 14. Such urging means includes a float 144 positioned within the fourth chamber 118. Float 144 is moveable within the fourth chamber towards and away from the fourth passage 120 and includes a first end 146 which engages the second fluid 122 and a second end 148. A spring 150 is positioned within the fourth chamber and engages the second end 148 of the float to urge the float towards fluid 122.

Figure 3:
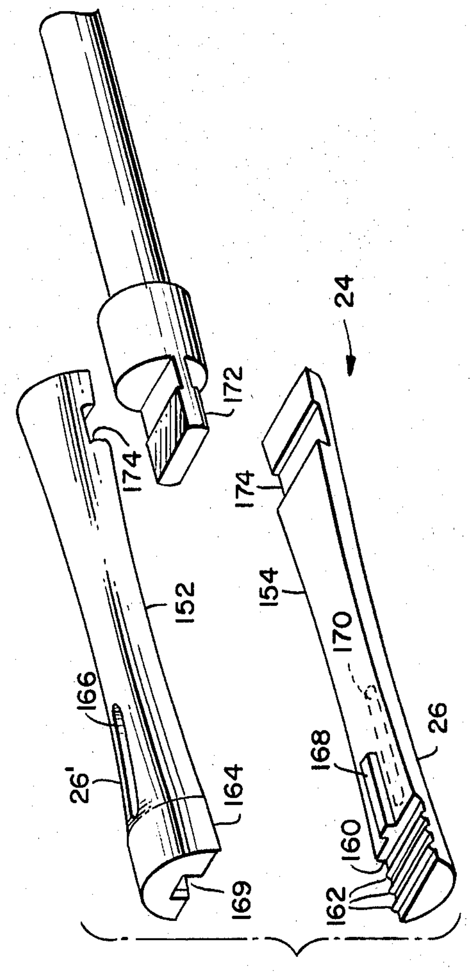
FIG. 3 is a partial perspective view.

FIG. 3 depicts the preferred embodiment of the gripping means 24 which is depicted as including a first elongated jaw member 152 and an opposing second elongated jaw member 154. The first jaw member includes a first camming surface 26' and the second jaw member includes a second camming surface 26. Such jaw members are moveable away and towards each other to opened and closed positions, respectively. For example, jaw member 154 may include a contact engaging surface 160 comprising ribs 162 for engaging or disengaging a contact when ribs 162 and surface 164 of jaw member 152 move towards or away from each other, respectively. As depicted, one of the jaw members 152 includes a slot 166 therein, into which ribbed portion 168 extends. Portion 168 forms a stop for a pin inserted at 169. An additional slot 170 may be positioned in jaw member 154. In this embodiment the barrel includes a pin 172 which extends into the additional slot 170 to properly align the jaw members relative to barrel 4. The jaw members are attached to the elongated rod 20, and to this end the rod is provided with a stepped tab 172 which mates with grooves 174 in the jaw members 152, 154. This is depicted in FIGS. 1 and 3 from which it should be clear that any movement of rod 20 will cause corresponding movement of jaw members 152, 154. It is further noted that the jaw members 152, 154 are positioned within elongated bore 48 and slide relative to the surface of such bore. Since the surface of the elongated bore 48 comprises the cam follower 32, movement of the jaw member cam surfaces 26, 26' and cam follower 32 relative to each other will cause the jaw members to close or relieve them depending on the direction of such movement as further described hereinafter.

In operation, when it is desired to pull a pin the trigger 126 is squeezed to cause the end 138 of valve 124 to move out of passage 120 and compress spring 142. While continuing to squeeze trigger 126, lever 108 is also squeezed to cause end 104 of plunger 98 to exert pressure against fluid 94 in chamber 86. Such pressure causes fluid 94 which extends into chamber 64 and 16' to bear against shoulder 66 of piston 30 and the surface 96 of piston 28. Since spring 34 is bearing against piston 28, the fluid pressure against shoulder 66 will initially cause piston 30 to slide along rod 20 until the piston engages stop member 22. Such movement of the piston 30 causes forward movement of its cam follower 32 relative to the cam surfaces 26, 26′ to cause the jaw members 152, 154 to move towards one another to grip or bite a pin to be pulled. Such position is shown in FIG. 1. It should be noted that at this point in the operation spring 34 has caused piston 28 to bear against stop member 12 through nut 176 and that therefore when piston 30 engages stop member 22, as depicted in FIG. 1, movement of piston 30 and cam follower 32 ceases.

By further squeezing lever 108, the plunger 98 exerts additional pressure upon fluid 94. In this manner fluid pressure in chamber 16′ builds up to the point where the force which such fluid exerts upon piston 28 will be greater than the opposing force spring 34 exerts upon piston 28. At this point, the fluid 94 will cause piston 28 to move away from stop member 12. Such movement of piston 28 will compress spring 34 and cause stop member 22 and gripping jaws 152, 154 to move towards stop member 12. Since piston 30 is engaging stop member 22, such movement of piston 28 will also cause piston 30 to move towards stop member 12. It will be apparent that during this phase of the operation cam surfaces 26, 26′ will not be moving relative to cam follower 32 and therefore as the gripping jaws 152, 154 are moved towards stop member 12 the pin to be pulled will continue to be gripped by such jaws and will be pulled towards stop member 12. As piston 30 moves towards stop member 12, spring 150 urges float 144 towards fluid 122, and in this manner float 144 urges fluid 122 through passage 120 towards chamber 14′. When the pin to be pulled has been pulled as desired the trigger 122 is released so that spring 142 urges valve end 138 into passage 120. Lever 108 is then released so that spring 34 urges piston 28 against fluid 94 and towards stop member 12. The pressure so exerted upon fluid 94 by piston 28 causes fluid 94 to return towards chamber 86 as the opposing pressure formerly exerted by plunger 98 against fluid 94 decreases and plunger 98 moves to the right as viewed in FIG. 2. Since valve end 138 is in passage 120 fluid 122 is prevented from being removed from chamber 14′. Consequently, the force exerted by piston 28 against fluid 94 causes fluid 94 in both chambers 64 and 16′ to return towards chamber 86. As piston 28 moves towards stop member 12, the rod 20 urges jaws 152, 154 away from stop member 12. However, in view of the absence of any force being exerted against shoulder 66, piston 30 does not move at this time. Such movement of jaws 152, 154 causes cam surfaces 26, 26′ to move away from stop member 12 while cam follower remains stationary. In this manner, jaws 152, 154 are relieved so they may be moved away from one another to an open position so that the tool may be used to pull another pin as desired.

It will be apparent that sealing means may be positioned as desired or required within the apparatus to assure that the fluids do not leak, as for example, from one chamber to another when such fluids are subjected to pressure. Such seals may be any type known in the art and are not described herein. Some of such sealing means are depicted in the drawings but others have been omitted to simplify the views depicted. For example, sealing means may be positioned in the space beween ribs 50 and 52 and the space between ribs 52 and 54. Such sealing means, not shown, engage the surface of the bore 6 to prevent leakage of fluid from chambers 14′ and 64. Similar sealing means, not shown, may be positioned in the space between the ribs of piston 28 to prevent leakage of fluid from chamber 16′.

In the preferred embodiment, the distance a pin may be inserted into the tool 2 through opening 169 may be varied by adjusting the position of piston 28 upon rod 20. Such adjustment may be made by turning the nuts depicted in FIG. 1 which hold piston 28 in place. The effect of such an adjustment will be to lengthen or shorten the end of the rod 20 which extends in cavity 14, depending upon the direction the nuts are turned. In this manner, the position of pin stop 168 relative to the tip of the tool may be adjusted.

Although the preferred embodiment, has been described as including a body 84, which is depicted in the drawings as a hand tool, the present invention is not limited to such a structure. For example, the present invention also contemplates the remote operation of the tool by providing hydraulic means which are remote from barrel 4 but connected thereto by hoses. Such hydraulic means replace body 84 and the mechanisms associated therewith which cause movement of pistons 28 and 30.

The embodiments which have been described herein are but some of several which utilize this invention and are set forth here by way of illustration but not of limitation. It is apparent that many other embodiments which will be readily apparent to those skilled in the art may be made without departing materially from the spirit and scope of this invention.

What is claimed is:

1. Apparatus for pulling a contact comprising
(a) a barrel having a bore extending axially of said barrel, said barrel having a first end and a second end;
(b) a first stop member internal of said barrel and plugging said bore to define a first bore cavity to one side of said first stop member and to define a second bore cavity to the opposite side of said first stop member, said first stop member having an aperture therethrough which extends from said first bore cavity to said second bore cavity;
(c) an elongated rod positioned in said bore and extending through said aperture from said first bore cavity to said second bore cavity, said rod including a second stop member positioned along the portion of said rod extending into said first bore cavity;
(d) means attached to the end of said rod for gripping a pin to be pulled, said gripping means including at least one camming surface;
(e) a first piston fixedly attached to the opposite end of said rod extending into said second bore cavity;
(f) a second piston slidably attached to said rod in said first bore cavity, said second piston being positioned between said first and second stop members and including a cam follower which engages said camming surface;
(g) first means attached to said barrel to move said first piston towards said first stop member so that said elongated rod attached to said first piston moves said camming surface relative to said cam follower to relieve said gripping means; and,
(h) second means attached to said barrel to move said second piston towards said second stop member so that said cam follower is moved relative to said camming surface to close said gripping means and to move said first piston away from said first stop member so that said elongated rod attached to said first piston moves said second piston and said gripping means towards said first stop member.

2. The apparatus of claim 1 wherein said second piston comprises an elongated cylindrical member slideably attached to said rod by a first elongated bore extending from one end of said cylindrical member towards the other end, said elongated cylindrical member including a second elongated bore of greater diameter than said first elongated bore extending from the said other end towards said one end, the inner surface of said second elongated bore including said cam follower, said cylindrical member including a first shoulder where said first and second elongated bores meet, the outer surface of said cylindrical member including at least one cylindrical rib portion extending therefrom towards the surface of the bore of said barrel, said cylindrical rib including a first cylindrical portion nearest but spaced from said other end and a second cylindrical portion nearest said one end, said second cylindrical portion being of less diameter than said first cylindrical portion and having a surface spaced from the surface of the bore of said barrel to form a first chamber, said cylindrical rib including a second shoulder where said first and second cylindrical portions meet.

3. The apparatus of claim 2 wherein said first stop member includes a cylindrical body positioned within and engaging the surface of the bore of the barrel, said body having a cylindrical sleeve extending therefrom to form an air chamber, the outer surface of said sleeve engaging the surface of the bore of the barrel and the inner surface of said sleeve engaging said spaced surface.

4. The apparatus of claim 3 wherein said barrel includes a first vent, said sleeve includes a second vent extending to said air chamber, and said vents are in communication one with the other.

5. The apparatus of claim 4 wherein said first means includes a spring internal of the bore of said barrel and extending between the first end of said barrel and said first piston.

6. The apparatus of claim 5 wherein said second means includes a body, said body having a second chamber therein, a first passage extending between said first and second chambers, a second passage extending between said second chamber and said second bore cavity at a position between said first stop member and said first piston, a third passage extending between said first and second passages, a first fluid within said chambers and said passages, and means attached to said body for compressing said first fluid and causing said first fluid to exert a first force against said second shoulder to slide said second piston towards said second stop member and subsequently causing said first fluid to exert a second force against said first piston to move said first piston away from said first stop member.

7. The apparatus of claim 6 wherein said first fluid compressing means includes a plunger positioned within said second chamber, the outer surface of said plunger being in engagement with the surface of said second chamber, said plunger including a first end which engages said first fluid, and a second end, and wherein said body further includes a lever pivotally attached to said body and to said second end of said plunger.

8. The apparatus of claim 7 wherein said body further includes a third chamber therein, a fourth chamber therein, and a fourth passage extending between said third and fourth chambers and further extending between said third chamber and said first bore cavity at a position between said second piston and said second end of said barrel, a second fluid being in said fourth chamber, said fourth passage and said first bore cavity, a valve mounted for movement within said third chamber, means positioned within said fourth chamber for urging said fluid towards said first bore cavity, and means attached to said valve for moving said valve into and out of said fourth passage to close and open said fourth passage, respectively.

9. The apparatus of claim 8 wherein said urging means includes a float positioned within said fourth chamber, said float being moveable within said fourth chamber towards and away from said fourth passage, said float including a first end which engages said second fluid, and a second end, and a spring positioned within said fourth chamber, said spring engaging the second end of said float to urge said float towards said second fluid.

10. The apparatus of claim 9 wherein said valve moving means includes a trigger, said trigger having one end thereof pivotally attached to said valve and the other end thereof pivotally attached to said lever, said valve including a first end extending towards said fourth passage and a second end extending away from said fourth passage, and a spring positioned within said third chamber, said spring engaging the second end of said valve to urge said valve towards said fourth passage.

11. The apparatus of claim 10 wherein said gripping means includes a first elongated jaw member and an opposing second elongated jaw member, said first jaw member including a first camming surface and said second jaw member including a second camming surface, said jaw members being moveable away and towards each other to opened and closed positions, respectively.

12. The apparatus of claim 11 wherein one of said jaw members includes a slot therein and the other of said jaw members includes a ribbed portion, said ribbed portion extending into said slot.

13. The apparatus of claim 12 wherein an additional slot is positioned in one of said jaw members and said barrel includes a pin which extends into said additional slot.

14. The apparatus of claim 13 wherein at least one of said jaw members includes a contact engaging surface comprising at least one rib for contact engagement.

15. The apparatus of claim 14 wherein said first piston includes an aperture extending therethrough, said rod includes a threaded portion and extends through said first piston aperture so that said threads extend from said first piston at each end thereof, and wherein a first nut is threaded upon said threaded portion and engages one end of said first piston and a second nut is threaded upon said threaded portion and engages the opposite end of said first piston.

* * * * *